United States Patent [19]
Asato et al.

[11] Patent Number: 5,291,457
[45] Date of Patent: Mar. 1, 1994

[54] SEQUENTIALLY ACCESSIBLE NON-VOLATILE CIRCUIT FOR STORING DATA

[75] Inventors: Creigton S. Asato; Christoph Ditzen, both of San Jose; James A. Rowson, Fremont, all of Calif.

[73] Assignee: VLSI Technology, Inc., San Jose, Calif.

[21] Appl. No.: 839,192

[22] Filed: Feb. 20, 1992

[51] Int. Cl.$^5$ .................. G11C 7/00; G11C 19/00
[52] U.S. Cl. .................. 365/239; 365/240; 365/189.12; 365/78
[58] Field of Search .......... 365/78, 189.12, 239, 365/240

[56] References Cited

U.S. PATENT DOCUMENTS

| | | | |
|---|---|---|---|
| 3,708,690 | 1/1973 | Paivinen | 365/239 |
| 3,742,466 | 6/1973 | Hamm et al. | 365/240 |
| 3,893,088 | 7/1975 | Bell | 365/240 |
| 4,872,663 | 10/1989 | Baranyai et al. | 365/78 |

FOREIGN PATENT DOCUMENTS 59-190751  10/1984  Japan .................. 365/240

Primary Examiner—Eugene R. LaRoche
Assistant Examiner—Andrew Tran
Attorney, Agent, or Firm—Burns, Doane, Swecker & Mathis

[57] ABSTRACT

A sequentially accessible, non-volatile data storage circuit for generating constants includes a logic array for non-volatile storage of programmed data words and a recirculating shift register for causing the first one of the data words to appear at a data output of the data storage circuit in response to a reset signal and to cause the next data word to appear at the data output in response to a clock signal.

14 Claims, 3 Drawing Sheets

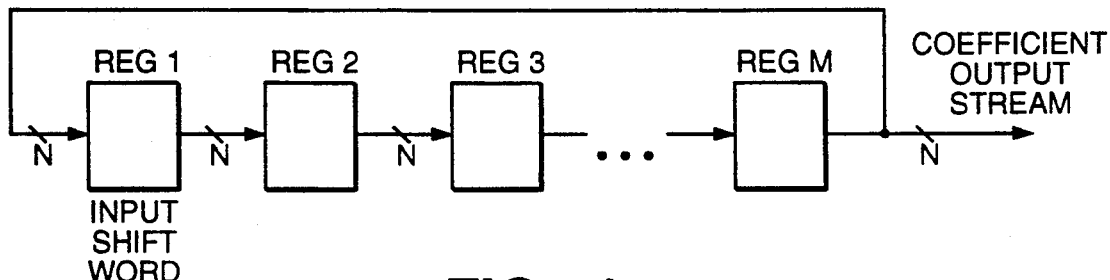
FIG._1
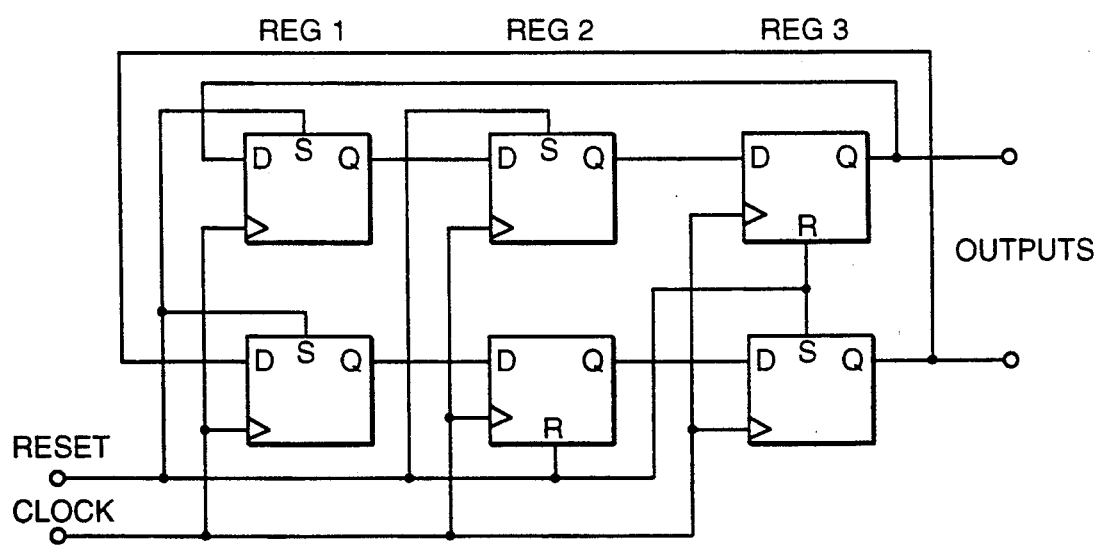
FIG._2

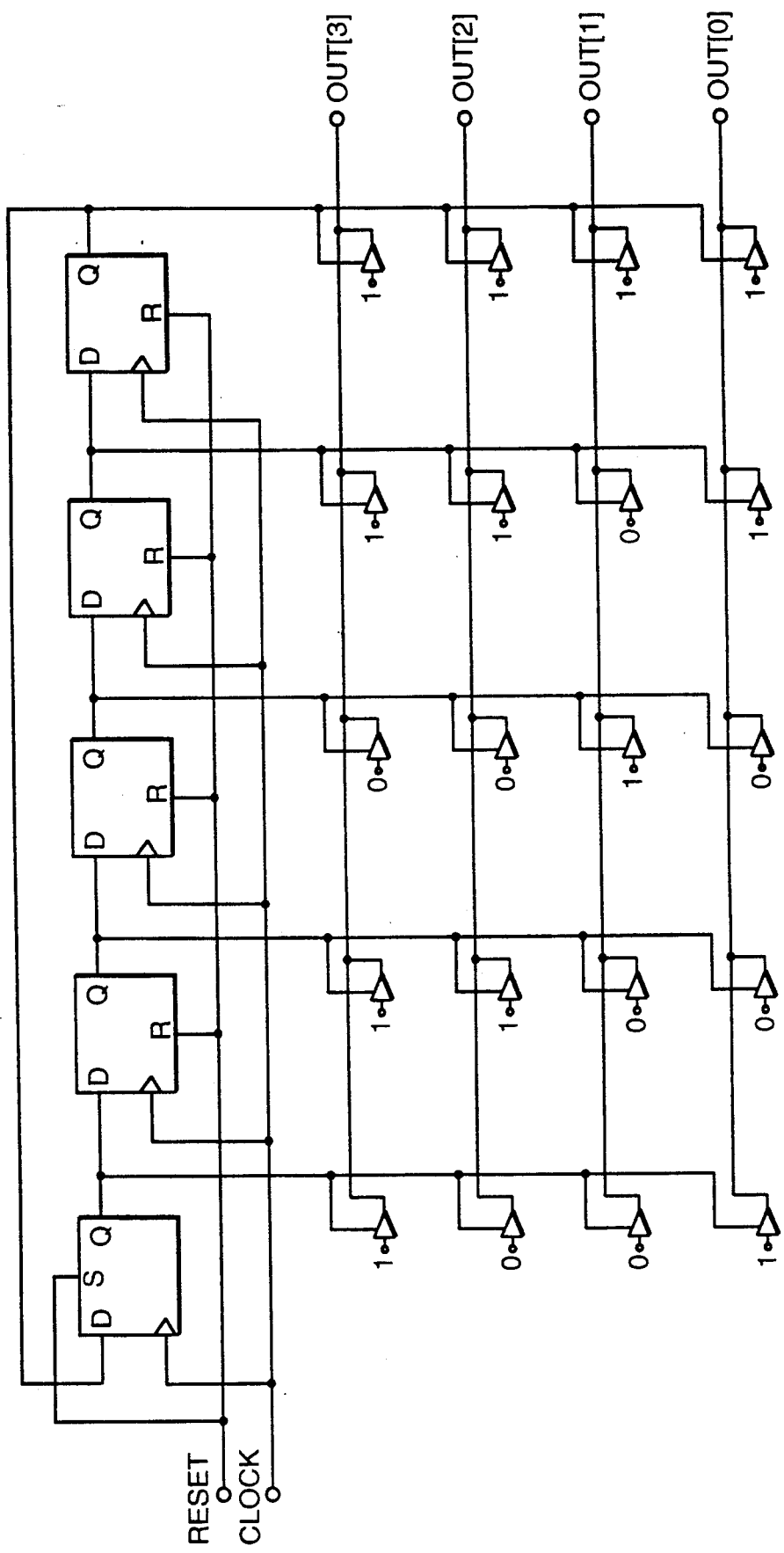
FIG._3

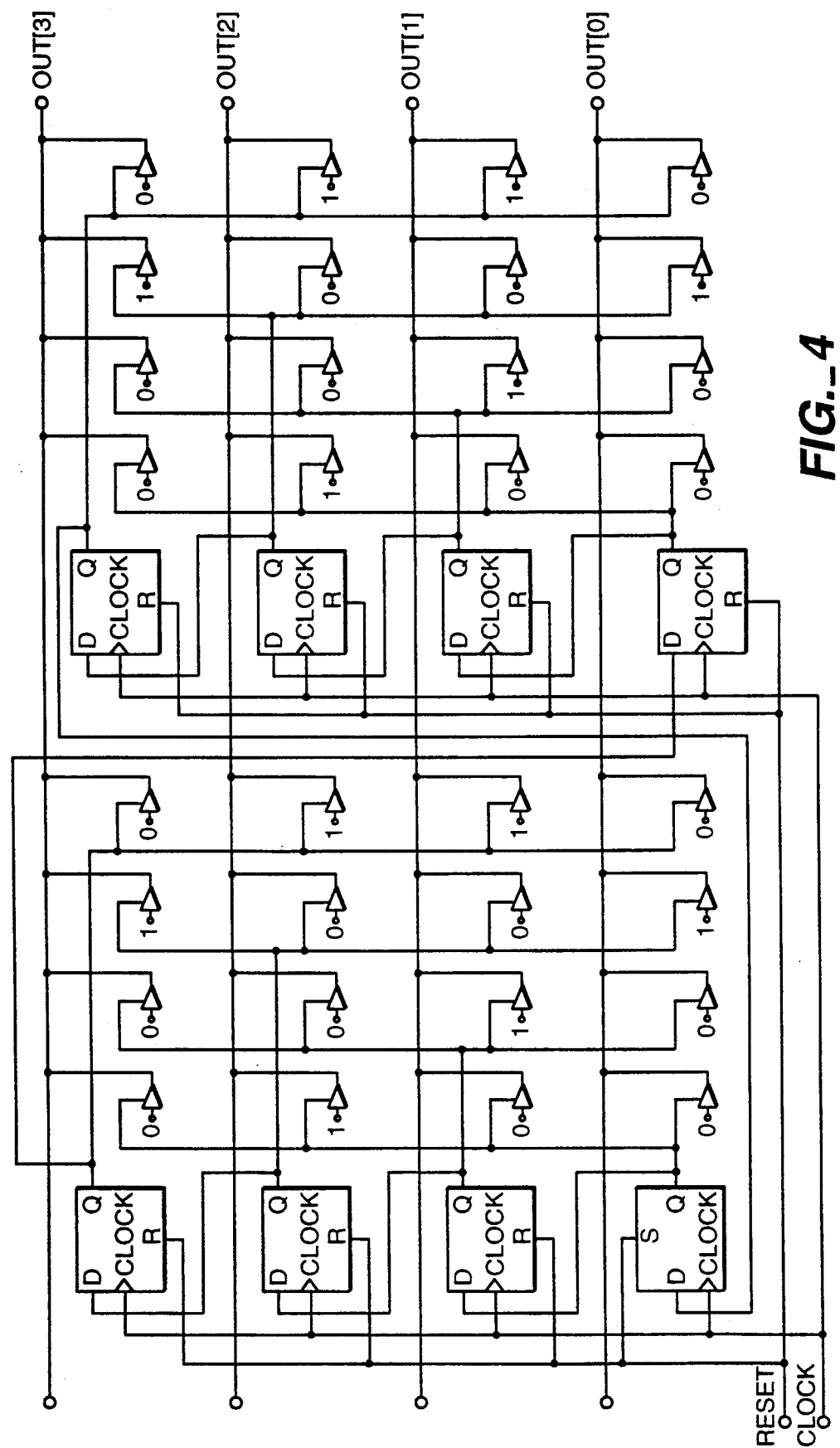
FIG._4

SEQUENTIALLY ACCESSIBLE NON-VOLATILE CIRCUIT FOR STORING DATA

BACKGROUND OF THE INVENTION

1. Field of the Invention

The present invention relates to digital memory circuits and, more particularly, to digital memory circuits that provide a predetermined series of fixed digital data words.

2. State of the Art

In the field of digital signal processing, it is often necessary to generate cyclically-repeated, multi-bit constant sequences. Such sequences must be generated, for example, in digital filters of the finite impulse response (FIR) type. In those filters, each of a series of incoming data points $x_i$ is multiplied in turn by each of a series of constant coefficients $A_i$, with the resulting series of products being added together. The generation of cyclically-repeated, multi-bit constant sequences is also necessary when computing Fast Fourier Transforms (FFT) as well as in other digital signal processing applications.

It is known to generate cyclically-repeated, multi-bit sequences by using a read only memory (ROM) in conjunction with an address generator. In such an arrangement, because storage and control are realized separately, it is difficult to realize a suitable constant generator in bit-slice form. The reason for such difficulties is that as the number of constants in the sequence increases, the number of ROM data locations increases linearly while the number of ROM address bits and hence the size of an address counter portion of the address generator increases only logarithmically. A single bit-slice size therefore cannot be used.

SUMMARY OF THE INVENTION

Generally speaking, the present invention provides a sequentially accessible, non-volatile data storage circuit that operates as a constant generator. More particularly, the non-volatile data storage circuit includes a logic array for non-volatile storage of programmed data words and a recirculating shift register for causing the first one of the data words to appear at a data output of the data storage circuit in response to a reset signal and to cause the next data word to appear at the data output in response to a clock signal.

According to one preferred embodiment of the present invention, the logic array is an array of three-state buffers or the equivalent and the recirculating shift register is composed of a number of flip-flops equal in number to the number of data words connected in series such that the data output of each of the flip-flops is connected to a data input of exactly one other of the flip-flops. According to another embodiment of the present invention, the logic array and the recirculating shift register are both realized using a single array of flip-flops.

BRIEF DESCRIPTION OF THE DRAWINGS

The present invention can be further understood with reference to the following description in conjunction with the appended drawings, wherein like elements are provided with the same reference numerals. In the drawings:

FIG. 1 is a block diagram of a recirculating shift register that can be used in the present invention;

FIG. 2 is a block diagram showing in greater detail than FIG. 1 one embodiment of the coefficient generator of the present invention using an array of flip-flops;

FIG. 3 is a block diagram of another embodiment of the constant generator of the present invention using an array of three-state buffers; and FIG. 4 is a block diagram of a particularly advantageous layout of the constant generator circuit of FIG. 3.

DETAILED DESCRIPTION OF THE PREFERRED EMBODIMENTS

In FIG. 1, a constant generator circuit comprises an N-bit wide recirculating shift register wherein M registers are connected in series such that an N-bit wide data output of each of the registers is connected to a data input of exactly one other of the registers. For convenience of illustration, the registers are shown as being arranged in series. From left to right in the series, the first data register is designated as Register 1 and the last data register is designated as Register M. The output of Register M is chosen as the output of the constant generator circuit and also provides the input of Register 1. The contents of Register M is, therefore, the output shift word and the contents of Register 1 is the input shift word.

In operation of the circuit of FIG. 1, a clock signal causes the data output of each respective register to assume the same digital value as its data input. More particularly, at the occurrence of each clock signal, the shift word contained in each of the registers advances to the next succeeding register. The output shift word in Register M is the output of the constant generator circuit and is also the input of Register 1. In this manner, the entire sequence of constants is produced at the output of the constant generator circuit every M clock cycles.

Also in operation of the circuit of FIG. 1, a predetermined sequence of constants can be loaded into the registers of the recirculating shift register using a single reset signal. As an illustration of such operation, FIG. 2 shows the circuit of FIG. 1 for the case where N=2 and M=3. In this example, the registers 1-3 are each comprised of two flip-flops. For each register, one of the flip-flops stores a less-significant bit value and the other flip-flop stores a more-significant bit value. The two flip-flops in each register are connected in series such that a data output of each of the flip-flops is connected to a data input of exactly one other of the flip-flops. A single clock signal is provided to each of the flip-flops of each of the registers.

As further shown in FIG. 2, a reset signal is provided to each of the flip-flops of each of the registers such that each bit of each of the registers is loaded with a predetermined binary value upon the occurrence of a reset signal. If the predetermined binary value is a binary "0," then the reset signal is connected to a reset input R of the flip-flop. On the other hand, if the binary value is a binary "1", the reset signal is connected to the set input S of the flip-flop. As a result, upon the occurrence of a reset signal, Register 1 is preset to 11, Register 2 is preset to 10, Register 3 is preset to 01, and the output of the circuit is 01 (the contents of Register 3). Then, upon the occurrence of the first clock signal, the output changes to 10 as the contents of Register 2 are shifted to Register 3, the contents of Register 1 are shifted to Register 2 and the contents of Register 3 are shifted to Register 1. Upon occurrence of the second clock signal, the output changes to 11 and upon the occurrence of a third clock signal the output changes back to the original output value 01.

As shown in FIG. 3, a space-efficient constant generator circuit can be realized by using an array of three-state buffers. In this embodiment, the recirculating shift register is only 1 bit wide. Instead of actually storing the sequence of multi-bit constants, the single-bit recirculating shift register is used to enable, in turn, the output of each of the multi-bit constants, which are stored in an array of three-state buffers having their inputs wired to the appropriate binary value. The three-state buffers are arrayed in N rows and M columns so as to store M N-bit constants. The outputs of each of the three-state buffers in a lower-most row are connected in common to an output signal out[0], the outputs of the three-state buffers of a next row are connected in common to an output signal out[1], and so forth. The enable signals of each of the three-state buffers of a particular column are each connected to the output of a corresponding flip-flop in the recirculating shift register. The reset signal sets the left-most one of the flip-flops of the recirculating shift register to "1" and resets all of the other flip-flops to "0". As the "1" is shifted to each of the flip-flops in turn, the output of that flip-flop enables a constant value hard-wired into the three-state buffers of the corresponding column to be output at the outputs out[0] to out[3].

In the present example, the sequence of multi-bit constants stored in the three-state buffers is 1001, 1100, 0010, 1101 and 1111 and is output in that order. Upon the occurrence of a reset signal, the output of the left-most flip-flop in the recirculating shift register becomes 1 and enables the constant 1001 stored in the left-most column of three-state buffers to be output. Upon the occurrence of a first clock signal, the "1" circulates in the recirculating shift register one position to the right to enable the constant 1100 stored in the next-to-left-most column of three-state buffers to be output. Upon the occurrence of a second clock signal, 0010 is output, and so forth until the occurrence of the fifth clock signal, at which time 1001 is again output and the cycle repeats.

The constant generator circuit of FIG. 3 can be made smaller than the constant generator circuit of FIG. 2 because three-state buffers require less area than flip-flops. The circuit can be more compact still by careful planning of the layout of the circuit elements. In particular, the flip-flops in the recirculating shift register of FIG. 3 are wider than a three-state buffer, but both are about the same height. By arranging each of the flip-flops above a corresponding column of three-state buffers, as shown in FIG. 3, is determined by the wider flip-flops, leaving unused area around the narrower three-state buffers.

A more compact column arrangement is shown in FIG. 4. In this embodiment, the flip-flops of the recirculating shift register are arranged in columns instead of in rows. If, as in the present instance, the number of words M is greater than the number of bits per word N, then multiple columns of flip-flops are required. Efficient layout is achieved by using multiple modules of N×N three-state buffers, each with its associated column of flip-flops. If the number of words is not an integral multiple of the number of bits per word, then the last module will contain a number of columns of three-state buffers equal to the remainder of the number of words divided by the number of bits per word, associated with a column of flip-flops having the same number of rows as the number of columns of three-state buffers. In other words, the three-state buffer portion of the last module will be only partially complete in a column direction and the flip-flop portion of the last module will to the same extent be only partially complete in a row direction.

The constant generator circuit of FIG. 4 is readily realizable as bit-slice logic and can be easily integrated into a bit-slice architecture.

It will be appreciated by those of ordinary skill in the art that the present invention can be embodied in other specific terms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A sequentially accessible, non-volatile data storage circuit comprising:
   logic array means for non-volatile storage of a plurality of predetermined programmed data words at least some of which are non-zero and at least some of which are different from one another; and
   recirculating shift means interconnected with said logic array means for causing a first one of the data words in a predetermined order of the data words to appear at a data output of the data storage circuit in response to a reset signal and to cause a next one of the data words to appear at the data output in response to a clock signal.

2. The apparatus of claim 1 wherein the logic array means comprises an array of three-state buffers.

3. The apparatus of claim 2 wherein said recirculating shift means comprises a number of flip-flops equal in number to a number of the data words connected in series such that a data output of each of the flip-flops is connected to a data input of exactly one other of the flip-flops.

4. The apparatus of claim 3 wherein the reset signal causes all but one of the flip-flops to be reset and causes the one of the flip-flops to be set.

5. The apparatus of claim 4 wherein the clock signal causes the data output of the flip-flops to assume the same logic value as the data input of the flip-flops.

6. The apparatus of claim 5 wherein the data output of each of the flip-flops determines whether or not an associated data word will be presented at the data output of the data storage circuit.

7. The apparatus of claim 6 wherein the data output of each of the flip-flops is connected to a three-state enable control of each of a group of three-state buffers used to store a data word associated with respective ones of the flip-flops.

8. The apparatus of claim 7 wherein the flip-flops are arranged in a line parallel to a group of three-state buffers used to store a single data word, the group of three-state buffers also being arranged in a line.

9. The apparatus of claim 1 wherein the logic array means and said recirculating shift means are both realized using a single array of flip-flops.

10. The apparatus of claim 9 wherein the flip-flops form M groups of N flip-flops, each group corresponding to one of the data words.

11. The apparatus of claim 10 wherein each of the group of flip-flops has a data input that is the collection of data inputs of the constituent flip-flops of the group and has a data output that is the collection of data outputs of the constituent flip-flops of the group, the groups of flip-flops being series connected such that a data output of each of the groups is connected to a data input of exactly one other of the groups.

12. The apparatus of claim 11 wherein the reset signal causes the flip-flops in a group to be individually set, or reset, according to bit values of a predetermined data word.

13. The apparatus of claim 12 wherein the clock signal causes the data output of the flip-flops to assume the same value as the data input of the group of flip-flops.

14. An apparatus for storing M predetermined N-bit data words, comprising:

M×N flip-flops, every M flip-flop being connected together in series such that a data output of each of the M flip-flops is connected to a data input of exactly one other of the M flip-flops, each of the flip-flops being connected to a reset signal and being constructed to be set or reset when the reset signal is asserted according to bit values of the predetermined data words, at least some of which are non-zero and at least some of which are different from one another, each of the flip-flops also being connected to a clock signal so as to cause the data output of each of the flip-flops to assume the same logic value as the data input of each of the flip-flops when the clock signal is asserted, a data output of the apparatus being taken at the outputs of the N flip-flops that are set or reset according to the bit values of a first data word.

* * * * *